(12) United States Patent
Maruno et al.

(10) Patent No.: US 8,535,789 B2
(45) Date of Patent: Sep. 17, 2013

(54) BONDED MEMBER AND PROCESS FOR PRODUCING THE SAME

(75) Inventors: Masanori Maruno, Nara-ken (JP); Yoshinao Taniguchi, Miyagi-ken (JP); Yoshihiro Taguchi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 186 days.

(21) Appl. No.: 12/902,766

(22) Filed: Oct. 12, 2010

(65) Prior Publication Data
US 2011/0045262 A1 Feb. 24, 2011

Related U.S. Application Data

(63) Continuation of application No. PCT/JP2009/057750, filed on Apr. 17, 2009.

(30) Foreign Application Priority Data

Apr. 22, 2008 (JP) ................................ 2008-111812

(51) Int. Cl.
*B32B 7/02* (2006.01)
*B32B 27/00* (2006.01)
*B32B 27/06* (2006.01)
*B32B 27/08* (2006.01)
*B32B 37/12* (2006.01)

(52) U.S. Cl.
USPC ........ 428/215; 428/523; 428/484.1; 428/515; 428/447; 156/334

(58) Field of Classification Search
USPC ....... 428/215, 523, 484.1, 515, 447; 156/334
See application file for complete search history.

(56) References Cited

U.S. PATENT DOCUMENTS

| 2004/0242825 | A1* | 12/2004 | Shishido et al. ............... 526/309 |
| 2007/0238164 | A1* | 10/2007 | Kim .......................... 435/287.2 |
| 2009/0066935 | A1* | 3/2009 | Fujimoto et al. ................ 356/73 |
| 2009/0305068 | A1* | 12/2009 | Morishita et al. ............. 428/483 |

FOREIGN PATENT DOCUMENTS

| DE | 19851644 A1 | 8/1999 |
| JP | 2002129123 A * | 5/2002 |
| JP | 2002-265905 | 9/2002 |
| JP | 2002-80569 | 3/2005 |

(Continued)

OTHER PUBLICATIONS

Machine English Translation of JP2002/129123_A, Ozaki, Adhesive Composition for Polarizing Plate, May 9, 2002, JPO, whole document.*

(Continued)

*Primary Examiner* — David Sample
*Assistant Examiner* — Tahseen N Khan
(74) *Attorney, Agent, or Firm* — Brinks Hofer Gilson & Lione

(57) ABSTRACT

A microchip plate made such that polymer substrates made, in particular, of a cycloolefin polymer (COP) or a cycloolefin copolymer (COC) can be appropriately bonded to each other and a process for producing the microchip plate are provided. A microchip plate (1) of an embodiment is constituted by a first substrate (2) and a second substrate (3), which are bonded to each other through an adhesive layer (5), wherein the first substrate (2) and the second substrate (3) are formed by a COP or a COC, and the adhesive layer (5) is formed of paraffin or naphthene or formed including paraffin or naphthene and at least any one of an adhesion auxiliary material, a polymer constituting each of the first substrate and the second substrate, and a macromonomer.

17 Claims, 5 Drawing Sheets

(56) References Cited

FOREIGN PATENT DOCUMENTS

| | | | |
|---|---|---|---|
| JP | 2008-1760 | | 1/2008 |
| JP | 2008-7620 | | 1/2008 |
| JP | 2008001760 A | * | 1/2008 |
| WO | WO 2008065982 A1 | * | 6/2008 |

OTHER PUBLICATIONS

Machine English Translation of JP_2008/001760_A1, Yano, Adhesive Resin Composition, Jan. 10, 2008, JPO, whole document.*

International Search Report issued in corresponding PCT Application No. PCT/JP2009/057750; mailed Jul. 14, 2009.

Office Action issued in corresponding German Patent Application No. 112009000990.5, dated Jun. 29, 2012.

Habenicht, "Bonding: Basic Technology Applications" Diffusion Bonding, 1990.

Wako Pure Chemical Industries, Ltd., "Macro Azo Initiators" Polymer Related Fields, reprinted from website Jun. 29, 2012.

* cited by examiner

ADHESION PORTION (PARAFFIN)

15mm
25mm

~BONDING CONDITIONS~
- [ ] PRESSURE: 100kgf(2.6MPa)
- [ ] TEMPERATURE: 70°C
- [ ] BONDING TIME: 10min

FIG. 5A

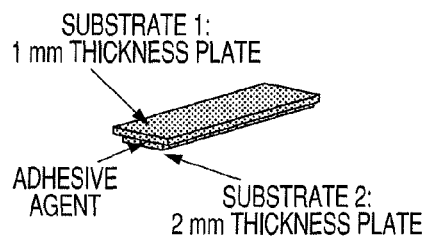

SUBSTRATE 1: 1 mm THICKNESS PLATE
ADHESIVE AGENT
SUBSTRATE 2: 2 mm THICKNESS PLATE

FIG. 5B

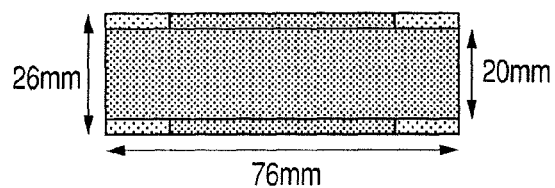

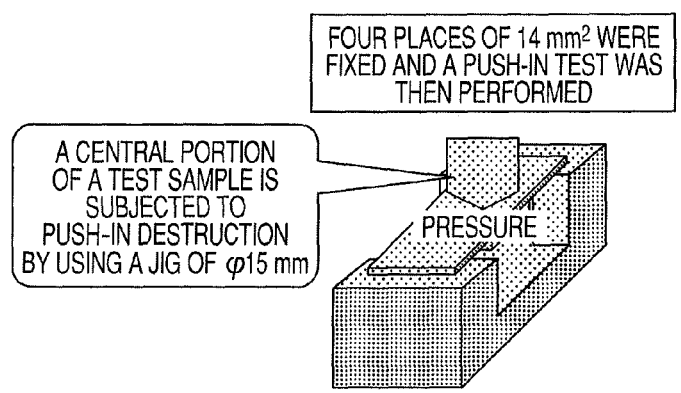

FOUR PLACES OF 14 mm² WERE FIXED AND A PUSH-IN TEST WAS THEN PERFORMED

A CENTRAL PORTION OF A TEST SAMPLE IS SUBJECTED TO PUSH-IN DESTRUCTION BY USING A JIG OF φ15 mm

PRESSURE

FIG. 6

~BONDING CONDITIONS~
- MATERIAL: PARAFFIN C
- TEMPERATURE: 50°C
- BONDING TIME: 5min

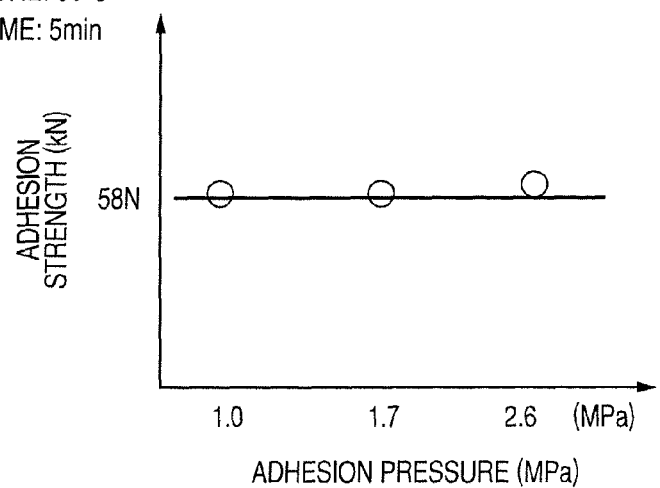

ADHESION STRENGTH (kN)
58N
1.0   1.7   2.6   (MPa)
ADHESION PRESSURE (MPa)

FIG. 7
DESTRUCTION TEST BY A PUSH-IN INDENTER
~SAMPLE~
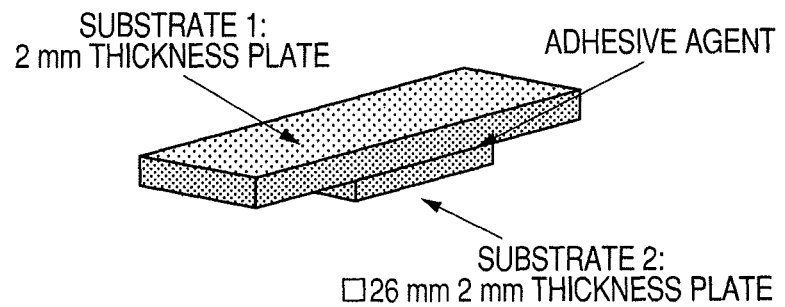
~DESTRUCTION TEST METHOD~
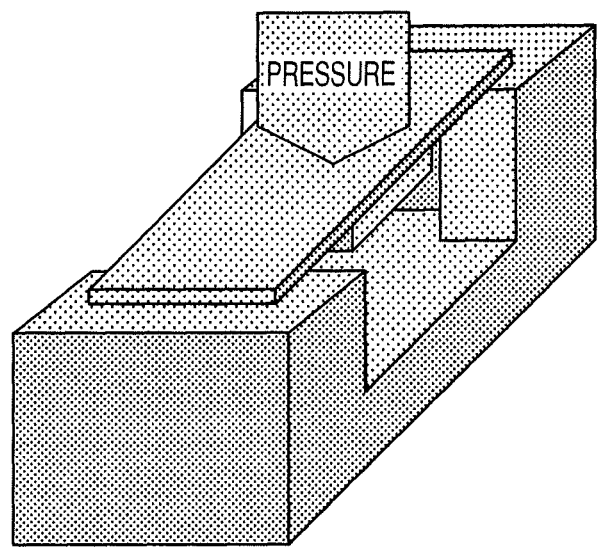

MEASUREMENT OF TENSILE STRENGTH IN A VERTICAL DIRECTION

BONDED MEMBER AND PROCESS FOR PRODUCING THE SAME

TECHNICAL FIELD

The present invention relates to a bonded member such as a microchip plate, which allows substrates formed of a cycloolefin polymer (COP) or a cycloolefin copolymer (COC) to be appropriately bonded to each other, and a process for producing the bonded member.

BACKGROUND ART

According to the recent development of micro-chemical technology, on-chip chemical reactions are frequently used in complex forming reactions, organic synthesis, solvent extraction, cell culture, chemical reaction control, or the like. In particular, a microchip plate called a biochip is used in a DNA test or the like.

As a matter of fact, a cycloolefin polymer (COP), a cycloolefin copolymer (COC), or the like has excellent transparency and low fluorescence and also allows a reduction in thickness, so that it is suitable for a substrate of a microchip plate.

However, in these low-fluorescent plastic materials, there is a problem that since a surface is inactive, for example, two substrates formed of the COP cannot be appropriately bonded to each other by an adhesive agent. Or, it is necessary to perform pretreatment such as ultrasonic fusion bonding, ultraviolet irradiation, matt treatment, corona treatment, or plasma treatment with respect to a surface of the substrate formed of the cycloolefin polymer (COP) or the cycloolefin copolymer (COC) before the substrates are bonded to each other by the adhesive agent.

Also, in an organic solvent disclosed in the invention described in the following Patent Citation 1, since substrates are melted and bonded to each other, there is a problem that cracks are generated in the substrate or a bonded surface, or flow paths easily collapse. Also, in a case where an organic solvent is used, a problem easily occurs in which the inside of the flow path is blocked by the organic solvent. Further, in most adhesive agents, there is also a problem that fluorescence is high.

[Patent Citation 1]: Japanese Unexamined Patent Application Publication No. 2005-80569

DISCLOSURE OF INVENTION

Technical Problem

Therefore, the present invention is for solving the above-mentioned problems that have occurred previously and has an object to provide a bonded member such as a microchip plate made such that substrates formed, in particular, of a cycloolefin polymer (COP) or a cycloolefin copolymer (COC) can be appropriately bonded to each other and a process for producing the bonded member.

Technical Solution

According to a first aspect of the invention, there is provided a bonded member including: a first substrate; a second substrate; and an adhesive layer, through which the first substrate and the second substrate are bonded to each other, wherein the first substrate and the second substrate are each formed of a cycloolefin polymer (COP) or a cycloolefin copolymer (COC), and the adhesive layer is formed of paraffin or naphthene or formed including paraffin or naphthene and at least any one of an adhesion auxiliary material, a polymer constituting each of the first substrate and the second substrate, and a macromonomer.

The paraffin or the naphthene is a polymer chain of hydrocarbon which is of a similar kind to a polymer chain of the cycloolefin polymer (COP) or the cycloolefin copolymer (COC), and has a small molecular weight in the range of several hundreds to several thousands. Accordingly, the paraffin or the naphthene easily diffuses between (easily enters into) the polymer chains of the cycloolefin polymer (COP) or the cycloolefin copolymer (COC) and can activate (can easily move) a molecular chain of a polymer surface which is made by the cycloolefin polymer (COP) or the cycloolefin copolymer (COC). Accordingly, in the present invention, by using the above-mentioned adhesive layer, it is possible to appropriately bond the substrates formed of the cycloolefin polymer (COP) or the cycloolefin copolymer (COC) to each other. Also, since an adhesive agent which is used in the present invention is a solventless adhesive or a dispersion solvent, unlike an organic solvent or the like, solvent cracks are not generated. Here, the "dispersion solvent" refers to a liquid body, in which a macromonomer is dispersed in paraffin or naphthene that is an essential component of the adhesive agent and which can be applied without melting the substrates formed of the COP or the COC. Further, according to the present invention, problems such as blockage of a flow path by the adhesive layer can be suppressed. Also, the above-mentioned adhesive layer is easily adjusted to have low fluorescence, compared to the substrates.

Also, according to a second aspect of the invention, there is provided a process for producing a bonded member including a first substrate, a second substrate, and an adhesive layer, through which the first substrate and the second substrate are bonded to each other, the process including the steps of:

applying an adhesive agent which is formed including paraffin or naphthene, or paraffin or naphthene and at least any one of an adhesion auxiliary material, a polymer constituting each of the first substrate and the second substrate, and a macromonomer, to a facing surface of at least any one of the first substrate and the second substrate, which are each formed of a cycloolefin polymer (COP) or a cycloolefin copolymer (COC); and bonding the first substrate and the second substrate to each other by the adhesive agent in a state where the facing surfaces of the first substrate and the second substrate are made to face each other with the adhesive agent interposed therebetween.

In the present invention, by using the above-mentioned adhesive layer, it is possible to appropriately bond the substrates formed of the cycloolefin polymer (COP) or the cycloolefin copolymer (COC) to each other. Also, since an adhesive agent in the present invention is a solventless adhesive or a dispersion solvent, solvent cracks do not generate. Further, it is possible to attain improvement in productivity such as being capable of forming a thin adhesive layer.

Also, in the present invention, it is preferable that the first substrate and the second substrate be each formed by a sheet having the thickness in the range of 10 μm to 10 mm.

Also, in the present invention, it is preferable that a number average molecular weight of each of the paraffin and the naphthene be in the range of 100 to 1000. Due to this, it is possible to improve adhesion strength, and furthermore, it is possible to appropriately suppress problems such as blockage of flow paths formed in the substrate by the adhesive layer or making the substrate brittle.

Also, in the present invention, it is preferable that a number average molecular weight of the polymer constituting each of the first substrate and the second substrate be equal to or more than 5000.

Also, in the present invention, it is preferable that a number average molecular weight of the macromonomer be equal to or more than 5000. In addition, in the present invention, it is preferable that a mixture ratio (proportion) of the macromonomer be in the range of 0.1% by weight to 80% by weight. Due to this, the macromonomer can be appropriately mixed with the paraffin or the naphthene and the effect of addition of the macromonomer, that is, the effect such as improvement in adhesion strength can be expected.

Also, in the present invention, it is preferable that the macromonomer be formed by an initiator having a bridged structure composed of a macromolecular chain, which is a soft segment, and an azo group, which are continuously bound.

Also, in the present invention, it is preferable that the macromonomer be formed to have the following structural formula.

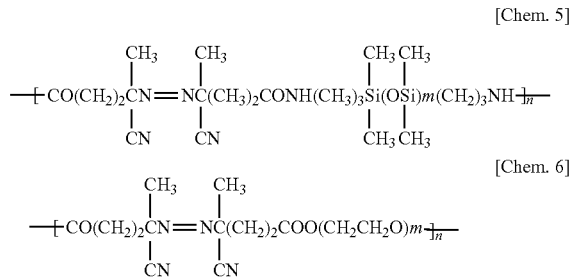

[Chem. 5]

[Chem. 6]

The macromonomer functions as an initiator due to cleavage of a section of an azo group and also makes an interpenetrating polymer network structure (IPN). The macromonomer can suppress excessive diffusion of the paraffin or the naphthene into the substrate and effectively improve adhesion strength of the adhesive layer by the IPN in the in-plane direction on one side thereof.

Advantageous Effects

According to the present invention, the substrates formed of the cycloolefin polymer (COP) or the cycloolefin copolymer (COC) can be effectively bonded to each other. Further, generation of cracks can be suppressed and problems such as blockage of the inside of the flow path by the adhesive layer can be suppressed. Also, the adhesive layer in the present invention can be adjusted to have low fluorescence, compared to the substrates formed of the cycloolefin polymer (COP) or the cycloolefin copolymer (COC), and can be appropriately used as an adhesive layer of a microchip plate, for example.

Further, in the process for producing a bonded member, it is possible to attain improvement in productivity such as providing capability for effectively bonding the substrates formed of the cycloolefin polymer (COP) or the cycloolefin copolymer (COC) to each other, suppressing generation of cracks, or forming a thin adhesive layer.

BEST MODE FOR CARRYING OUT THE INVENTION

FIG. 1 is a partial cross-sectional view of a microchip plate (a bonded member) of this embodiment cut in the thickness direction.

A microchip plate 1 of this embodiment is constituted by a first substrate 2 formed into a thin flat plate shape (a film shape), for example, a second substrate 3 of a flat plate shape (a plate shape) having flow paths 4 or the like formed in the surface side facing the first substrate 2 and having higher rigidity than the first substrate 2, and an adhesive layer 5 which bonds the first substrate 2 and the second substrate 3 to each other.

The first substrate 2 and the second substrate 3 are each formed of a cycloolefin polymer (COP) or a cycloolefin copolymer (COC).

As the COP, product name Zeonex or Zeonor made by Zeon Corporation or product name Arton made by JSR Corporation can be preferably used, and as the COC, product name Optorez made by Nihon Kasei Kogyo Co., Ltd. or product name Topas made by Polyplastics Co., Ltd. can be preferably used.

In the embodiment described above, the first substrate 2 is a film shape and the second substrate 3 is a plate shape. However, it is not limited to this. For example, both the first substrate 2 and the second substrate 3 may also be a plate shape having a certain thickness.

It is preferable that the first substrate 2 and the second substrate 3 be each formed by a sheet having a thickness in the range of 10 μm to 10 mm. In the "sheet", a plate shape and a film shape, which are described above, are included.

Illustrating with one example, when the first substrate 2 is a film shape, as described above, the thickness of the first substrate 2 is about 500 μm and the thickness of the second substrate 3 which is a plate shape is in the range of 0.5 mm to 10 mm.

In this embodiment, the adhesive layer 5 is formed of paraffin or naphthene, or formed including paraffin or naphthene and at least any one of an adhesion auxiliary material, a polymer constituting each of the first substrate and the second substrate, and a macromonomer. The thickness of the adhesive layer 5 is in the range of 1 μm to 100 μm.

The paraffin or the naphthene is a polymer chain of hydrocarbon which is of a similar kind to a polymer chain of the cycloolefin polymer (COP) or the cycloolefin copolymer (COC), and has a small number average molecular weight in the range of several hundreds to several thousands. Accordingly, the paraffin or the naphthene easily diffuses between (easily enters into) the polymer chains of the cycloolefin polymer (COP) or the cycloolefin copolymer (COC) and can activate (can easily move) the molecular chains of a polymer surface which is made by the cycloolefin polymer (COP) or the cycloolefin copolymer (COC). Accordingly, in this embodiment, by using the adhesive layer 5, it is possible to appropriately bond the substrates 2 and 3 formed of the cycloolefin polymer (COP) or the cycloolefin copolymer (COC) to each other. Also, since an adhesive agent in this embodiment is a solventless adhesive or a dispersion solvent, unlike an organic solvent or the like, solvent cracks are not generated. Here, the "dispersion solvent" refers to a liquid body, in which a macromonomer is dispersed in paraffin or naphthene that is an essential component of the adhesive agent and which can be applied without melting the substrate formed of the COP or the COC. Also, since the adhesive layer 5 can be adjusted to have low fluorescence compared to the substrates 2 and 3, the adhesive layer can be preferably used as an adhesive layer of the microchip plate 1. Fluorescence values of the first substrate 2 and the second substrate 3 are in the range of 8000 to 12000, whereas a fluorescence value of the adhesive layer 5 is in the range of 1500 to 2500.

The paraffin is expressed by the chemical formula of $C_nH_{2n+2}$ and the naphthene is expressed by the chemical formula of $C_nH_{2n}$. A number average molecular weight of each of the paraffin and the naphthene is in the range of 100 to 1000, preferably, in the range of 200 to 600, and an average carbon number is in the range of 7 to 72, preferably, in the range of 16 to 45. Due to this, it is possible to improve adhesion strength and furthermore, it is possible to appropriately suppress problems such as blockage of the flow paths 4 formed in the second substrate 3 by the adhesive layer 5 or making the substrates 2 and 3 brittle. In addition, the "number average molecular weight" and the "average carbon number" are derived from an adhesive agent before the adhesive layer 5 is formed through pressurization and the like.

In this embodiment, besides an adhesive layer composed of 100% paraffin or 100% naphthene, the adhesive layer 5 may also be an adhesive layer containing an adhesion auxiliary material, a polymer constituting each the first substrate 2 and the second substrate 3, or a macromonomer.

The "polymer constituting the first substrate 2 and the second substrate 3" is the cycloolefin polymer (COP) or the cycloolefin copolymer (COC) and a polymer of a low molecular weight (the molecular weight in the range of 1000 to 100000, in particular, 10000 to 40000) is suitable.

Also, as the "adhesion auxiliary material", the following can be used: A cycloolefin polymer or a cycloolefin copolymer which has a low molecular weight (molecular weight in the range of 500 to 10000), a binder resin (without distinction of thermosetting resin and thermoplastic resin), an acrylic, an initiator, a cross-linking agent, a thermoplastic elastomer, or the like. A mixture ratio of the "adhesion auxiliary material" in the adhesive layer is smaller than 50% by weight. In addition, here, since acrylic has a high fluorescence value, it is preferable that the acrylic be not contained in the adhesive layer of the microchip plate 1. Accordingly, in a case where acrylic is contained in an adhesive layer, the adhesive layer is suitable for use in an optical waveguide or the like other than the microchip plate.

The initiator is mainly used for making a polymerization reaction occur. In addition, the initiator itself is scarcely incorporated into a polymer chain. As the initiator, the kind thereof is not particularly limited, but the following initiator can be used: An initiator having a bridged structure such as organic peroxide such as bis(4-t-butylcyclohexyl)peroxydicarbonate (product name "Percadox 16" made by Kayaku Akzo Corporation, 10-hour half-life temperature=44° C.), t-hexylperoxypivalate (product name "Perhexyl PV" made by NOF Corporation, 10-hour half-life temperature=53° C.), 3,5,5-trimethylhexanoylperoxide (product name "Peroyl 355" made by NOF Corporation, 10-hour half-life temperature=59° C.), lauroylperoxide (product name "Peroyl L" made by NOF Corporation, 10-hour half-life temperature=62° C.), t-hexylperoxy-2-ethylhexanoate (product name "Perhexyl O" made by NOF Corporation, 10-hour half-life temperature=70° C.), t-butylperoxy-2-ethylhexanoate (product name "Perbutyl O" made by NOF Corporation, 10-hour half-life temperature=72° C.), benzoylperoxide (product name "Cadox B-CH50" made by Kayaku Akzo Corporation, 10-hour half-life temperature=72° C.), di-t-butylperoxy-2-methylcyclohexane (product name "Perhexa MC" made by NOF Corporation, 10-hour half-life temperature=83° C.), 1,1-bis(t-hexylperoxy)-3,3,5-trimethylcyclohexane (product name "Perhexa TMH" made by NOF Corporation, 10-hour half-life temperature=87° C.), 1,1-bis(t-hexylperoxy)cyclohexane (product name "Perhexa HC" made by NOF Corporation, 10-hour half-life temperature=87° C.), 1,1-bis(t-butylperoxy)-3,3,5-trimethylcyclohexane (product name "Perhexa 3M" made by NOF Corporation, 10-hour half-life temperature=90° C.), 1,1-bis(t-butylperoxy)cyclohexane (product name "Perhexa C" made by NOF Corporation, 10-hour half-life temperature=91° C.), 1,1-bis(t-butylperoxy)cyclododecane (product name "Perhexa CD" made by NOF Corporation, 10-hour half-life temperature=95° C.), t-hexylperoxyisopropylcarbonate (10-hour half-life temperature=95° C.), t-amylperoxy-3,5,5-trimethylhexanoate (product name "Kayaester AN" made by Kayaku Akzo Corporation, 10-hour half-life temperature=95° C.), 1,6-bis(t-butylperoxycarbonyloxy)hexane (product name "Kayalene 6-70" made by Kayaku Akzo Corporation, 10-hour half-life temperature=97° C.), t-butylperoxylaurate (product name "Perbutyl L" made by NOF Corporation, 10-hour half-life temperature=98° C.), t-butylperoxyisopropylcarbonate (product name "Perbutyl I" made by NOF Corporation, 10-hour half-life temperature=99° C.), t-butylperoxy-2-ethylhexylcarbonate (product name "Perbutyl E" made by NOF Corporation, 10-hour half-life temperature=99° C.), t-hexylperoxybenzoate (product name "Perhexyl Z" made by NOF Corporation, 10-hour half-life temperature=99° C.), t-butylperoxy-3,5,5-trimethylhexanoate (product name "Trigonox 42" made by Kayaku Akzo Corporation, 10-hour half-life temperature=100° C.), t-amylperoxybenzoate (product name "KD-1" made by Kayaku Akzo Corporation, 10-hour half-life temperature=100° C.), 2,2-bis(t-butylperoxy)butane (product name "Perhexa 22" made by NOF Corporation, 10-hour half-life temperature=103° C.), t-butylperoxybenzoate (product name "Perbutyl Z" made by NOF Corporation, 10-hour half-life temperature=104° C.), n-butyl-4,4-bis(t-butylperoxy)valerate (product name "Perhexa V" made by NOF Corporation, 10-hour half-life temperature=105° C.), dicumylperoxide (product name "Percumyl D" made by NOF Corporation, 10-hour half-life temperature=116° C.), or 1,3-bis(t-butylperoxyisopropyl)benzoate (product name "Percadox 14" made by Kayaku Akzo Corporation, 10-hour half-life temperature=121° C.); or an azo compound such as 2,2'-azobis-2,4-dimethylvaleronitrile (product name "ADVN" made by Otsuka Chemical Co., Ltd., 10-hour half-life temperature=52° C.), 1,1'-azobis(1-acetoxy-1-phenylethane) (product name "OTAZO-15" made by Otsuka Chemical Co., Ltd., 10-hour half-life temperature=61° C.), 2,2'-azobisisobutylonitrile (product name "AIBN" made by Otsuka Chemical Co., Ltd., 10-hour half-life temperature=65° C.), 2,2'-azobis-2-methylbutylonitrile (product name "AMBN" made by Otsuka Chemical Co., Ltd., 10-hour half-life temperature=67° C.), dimethyl-2,2'-isobutylate (product name "MAIB" made by Otsuka Chemical Co., Ltd., 10-hour half-life temperature=67° C.), or 1,1'-azobis-1-cyclohexanecarbonitrile (product name "ACHN" made by Otsuka Chemical Co., Ltd., 10-hour half-life temperature=87° C.).

The cross-linking agent is used for providing a three-dimensional structure. The cross-linking agent itself is often incorporated into a polymer chain. The cross-linking agent is not particularly limited, but the following can be taken as an example: An isocyanate-based cross-linking agent, an aziridine-based cross-linking agent, Coronate HL (hexamethylene diisocyanate, HDI-TMP adduct) made by Nippon Polyurethane Industry Co., Ltd., BXX5134 (an aziridine-based cross-linking agent) made by Toyo Ink Mfg. Co., Ltd., Epocros RPS-1005 (an oxazoline-based cross-linking agent) made by Nippon Shokubai Co., Ltd., TETRAD-X or TETRAD-C (both are an epoxy-based cross-linking agent) made by Mitsubishi Gas Chemical Company, Inc., or the like.

The macromonomer is a high-molecular-weight monomer having a polymerizable functional group and is made into a polymer by polymerization. In particular, in a macromonomer having both a polymerization function and an initiation function, the macromonomer itself not only has a three-dimensional structure as a cross-linking agent, but also is made into a polymer by polymerization. By being made into a polymer, the macromonomer acts to contain paraffin or naphthene, thereby suppressing excessive diffusion (entry) of paraffin or naphthene into the substrates 2 and 3. Incidentally, the smaller the number average molecular weight of paraffin or naphthene as an adhesive agent, the more easily the paraffin or the naphthene diffuses into the substrates 2 and 3. As described above, the substrates 2 and 3 can be appropriately bonded to each other by diffusion of the paraffin or the naphthene into the substrates 2 and 3. However, if the paraffin or the naphthene excessively diffuses into the substrates 2 and 3, in a case where the substrates 2 and 3 are particularly thin, the substrates become prone to brittleness. Accordingly, using the mixture of the macromonomer, diffusion of the paraffin or the naphthene into the substrates 2 and 3 is suppressed, whereby durability can be improved, and consequently by mixing the macromonomer into the adhesive layer 5 it is possible to improve adhesion strength between the substrates 2 and 3. Also, since the macromonomer can realize low fluorescence compared to the cross-linking agent or the like, the macromonomer is suitable for being contained in the adhesive layer 5 of the microchip plate 1.

The macromonomer is not particularly limited, but the following can be taken as an example: A methacryloyl group series macromonomer made by Toagosei Co., Ltd. (45% AA-6, AA-6SR, AA-6, AA-10, AS-6, AN-6S, AB-6, AW-6S, AA-714SK, AY-707S, AY-714S, AK-5, AK-30, or AK-32); a hydroxyl group series macromonomer made by Toagosei Co., Ltd. (HA-6S, HA-6SX, HN-6, or HK-20); an acrylate series macromonomer made by Kyoeisha Chemical Co., Ltd. (Light-acrylate 9EG-A, Light-acrylate 4EG-A, Light-acrylate PTGMA-250, Light-acrylate NPD-A, Light-acrylate 1.6HX-A, Light-acrylate BEPG-A, Light-acrylate 1.9ND-A, Light-acrylate MOD-A, Light-acrylate NCP-A, Light-acrylate BP-4EA, Light-acrylate BP-4PA, Light-acrylate BA-134, Light-acrylate BP-10EA, Light-acrylate HPP-A, Light-acrylate G-201P, Light-acrylate TMP-A, Light-acrylate TMP-3EO-A, Light-acrylate TMP-6EO-3A, Light-acrylate PE-3A, Light-acrylate PE-4E, Light-acrylate DPE-6A, or Light-acrylate FA-108); an epoxy series macromonomer made by Kyoeisha Chemical Co., Ltd. (Epolight M-1230, Epolight 40E, Epolight 100E, Epolight 200E, Epolight 400E, Epolight 70E, Epolight 70P, Epolight 200P, Epolight 400P, Epolight 1500NP, Epolight 1600, Epolight 80MF, Epolight 100MF, Epolight 4000, or Epolight 3002); an ester series macromonomer made by Kyoeisha Chemical Co., Ltd. (epoxy ester M-600A, epoxy ester 40EM, epoxy ester 70PA, epoxy ester 200PA, epoxy ester 80MFA, epoxy ester 3002A, epoxy ester 3000M, or epoxy ester 3000A); an urethane acrylate series macromonomer made by Kyoeisha Chemical Co., Ltd. (AH-600, AT-600, UA-306H, UA-306T, UA-306I, UA-510H, or UF-8001); or the like.

In this embodiment, it is preferable that the macromonomer be formed by an initiator having a bridged structure composed of a macromolecular chain, which is a soft segment, and an azo group, which are continuously bound. Specifically, it is preferable that the macromonomer be formed to have the following structural formula.

[Chem. 7]

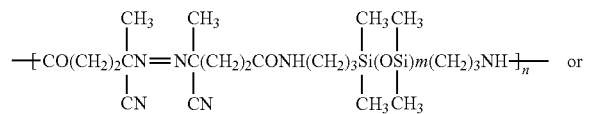

[Chem. 8]

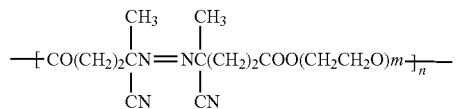

As the macromonomer described above, VPS series (Chem. 7) or VPE series (Chem. 8) made by Wako Pure Chemical Industries, Ltd. can be preferably used.

The macromonomer has a structure in which a macromolecular segment being a soft segment and an azo group are repeatedly bound. The macromonomer functions as an initiator due to cleavage of a section of an azo group and also makes an interpenetrating polymer network structure (IPN) within an adhesive layer.

Using the mixture of the macromonomer, diffusion of the paraffin or the naphthene into the substrates 2 and 3 is more effectively suppressed, whereby durability can be improved. Also, as described above, since the macromonomer makes the IPN, it is possible to improve the strength in an in-plane direction of the adhesive layer 5. By mixing the macromonomer into the adhesive layer 5, it is possible to more effectively improve adhesion strength between the substrates 2 and 3.

Also, in this embodiment, it is preferable that a molecular weight of the macromonomer be equal to or more than 5000 and it is more preferable that the molecular weight be in the range of 20000 to 100000. It is further more preferable that the molecular weight of the macromonomer be in the range of 20000 to 40000. Further, in this embodiment, it is preferable that a mixture ratio of the macromonomer in the adhesive layer 5 be in the range of 0.1% by weight to 80% by weight and it is more preferable that the mixture ratio be in the range of 3% by weight to 30% by weight. Due to this, the macromonomer can be appropriately mixed with the paraffin or the naphthene, so that the addition effect of the macromonomer, that is, the effect such as improvement in adhesion strength can be expected.

Next, a production method of the microchip plate 1 of this embodiment will be described.

As shown in FIG. 2, a liquid adhesive agent 6 is applied to a surface (facing surface) 2a of the first substrate 2 formed of the COP or the COC.

The adhesive agent 6 is formed of paraffin or naphthene, or is constituted including paraffin or naphthene and at least any one of an adhesion auxiliary material, a polymer constituting each of the first substrate and the second substrate, and a macromonomer.

Materials and the like of the "adhesive promoter", the "polymer constituting each of the first substrate and the second substrate", and the "macromonomer" are as described above.

Also, in a case where the macromonomer is added to the adhesive agent 6, it is preferable to use the macromonomer of the structural formula of Chem. 7 or 8 described above. Also, it is preferable that a molecular weight of the macromonomer be equal to or more than 5000 and it is more preferable that the molecular weight be in the range of 20000 to 100000 (further more preferably, in the range of 20000 to 40000). Further, it is preferable that a mixture ratio (proportion) of the macromonomer in the adhesive agent be in the range of 0.1% by weight to 80% by weight and it is more preferable that the mixture ratio be in the range of 3% by weight to 30% by weight. If the mixture ratio of the macromonomer is too small, the mixture effect of the macromonomer, that is, the effect such as improvement in adhesion strength cannot be sufficiently expected. Also, if the mixture ratio of the macromonomer is too large, the macromonomer cannot be appropriately mixed with the paraffin or the naphthene. The macromonomer is dissolved in methanol, for example. Therefore, if the amount of the macromonomer is increased, since the amount of the methanol which does not dissolve paraffin or naphthene is also increased, there is a problem that the macromonomer cannot be appropriately mixed with (is separated from) the paraffin or the naphthene. Accordingly, it is more preferable that the mixture ratio of the macromonomer be in the range of 3% by weight to 30% by weight.

Then, the second substrate 3 composed of the COP or the COC and having the flow paths 4 formed in the facing surface 3a side is disposed to face the first substrate 2 with the adhesive agent 6 interposed therebetween, and the first substrate 2 and the second substrate 3 are then pressurized while being heated by a hot press or the like.

At this time, it is preferable to heat the adhesive agent 6 within the range of 50° C. to 80° C. In addition, the smaller the number average molecular weight of the paraffin or the naphthene which constitutes the adhesive agent 6, the more the substrates 2 and 3 can be bonded to each other even at a low heating temperature. For example, in the adhesive agent used in experiments which will be described later, since it is possible to bond the substrates 2 and 3 to each other even at a room temperature (20° C.), the heating is not an indispensable condition. That is, existence or nonexistence of heating depends also on a material constituting the adhesive agent 6. However, in the case of performing heating, if a heating temperature is set to be equal to or more than 50° C., it was found that the adhesive agent 6 used in experiments which will be described later can appropriately bond the substrates 2 and 3 to each other. Also, in a case where the macromonomer expressed by Chem. 7 or 8 is added, since a cleavage temperature of an azo group is generally 60° C. or more, in the case of using the adhesive agent 6 including the macromonomer, it is effective to set the heating temperature to be 60° C. or more. In addition, if the heating temperature is set to be too high, a problem occurs in which due to softening of the substrates 2 and 3 formed of the COP or the COC, the flow paths 4 collapse through pressurization, cracks are generated in the substrates 2 and 3, or the like. Also, according to experiments which will be described later, if the heating temperature is set to be 80° C., since sufficient adhesion strength can be obtained, an upper limit of the heating temperature is set to be 80° C.

Also, the first substrate 2 and the second substrate 3 are pressurized by pressure in the range of 0.1 MPa to 10 MPa. Preferably, the pressure range of 1.0 MPa to 2.6 MPa, in which from experiments which will be described later it is found that it is possible to obtain almost constant adhesion strength, is used.

In FIG. 2, the adhesive agent 6 was applied to the entire surface of the surface 2a of the first substrate 2. In addition, as shown in FIG. 3, naturally, the adhesive agent 6 may be partly applied to the surface 2a of the first substrate 2. However, as shown in FIG. 2, application of the adhesive agent 6 to the entire surface of the surface 2a of the first substrate 2 is preferable because it is possible to improve adhesion strength. Also, a kinetic viscosity (40° C.) of the adhesive agent 6 in this embodiment is in the range of 4 $mm^2/S$ to 70 $mm^2/S$, and preferably, in the range of 10 $mm^2/S$ to 40 $mm^2/S$. Due to the kinetic viscosity at this level, even if the adhesive agent 6 is applied to the entire surface of the surface 2a of the substrate 2, as shown in FIG. 2, it is possible to appropriately specify blockage of the inside of the flow path 4 by the adhesive agent or contamination of the inner wall of the flow path 4. Further, it is also possible to perform bonding in a state where the adhesive agent 6 is applied to both the facing surfaces of the first substrate 2 and the second substrate 3.

According to the production method of the microchip plate 1 of this embodiment, it is possible to appropriately bond the substrates 2 and 3 formed of a cycloolefin polymer (COP) or a cycloolefin copolymer (COC) to each other. Also, since the adhesive agent 6 in this embodiment is a solventless adhesive or a dispersion solvent, unlike an organic solvent or the like, solvent cracks are not generated. Here, the "dispersion solvent" refers to a liquid body, in which a macromonomer is dispersed in paraffin or naphthene that is an essential component of the adhesive agent and which can be applied without melting the substrates formed of the COP or the COC.

Also, if the adhesive agent 6 in this embodiment is used, it is not necessary to perform pretreatment such as ultrasonic fusion bonding, ultraviolet irradiation, matt treatment, corona treatment, or plasma treatment with respect to the surfaces of the substrates 2 and 3 formed of the COP or the COC. Also, in this embodiment, since the liquid adhesive agent 6 is applied, compared to a case where, for example, an adhesive sheet is used, the amount of the adhesive agent 6 needed is reduced, and the adhesive layer 5 can be formed to be thin in the range of 1 μm to 100 μm (preferably, 30 μm or less). In a case where the adhesive sheet is used, a reduction in thickness cannot be promoted. Also, in a case where the adhesive sheet is used, since unnecessary adhesive sheet protruding from the substrates 2 and 3 must be cut and removed, productivity is poor. In contrast to this, in the production method of the microchip plate 1 of this embodiment, it is possible to effectively improve productivity, compared to previously.

This embodiment is not limited to the microchip plate, but can be applied to all "bonded members", in which substrates formed of a COP or a COC are bonded to each other through an adhesive layer, such as an optical member and the like.

EXAMPLE

Experiment of Adhesion Properties According to Materials

The first substrate and the second substrate were formed by materials shown in the following Table 1.

TABLE 1

| Material | Adhesion |
| --- | --- |
| COP (Zeonex) | ⓒ |
| COP (Arton) | ⓒ |
| COC (Optorez) | ⓒ |
| COC (Topas) | ⓒ |
| PMMA (Parapet) | x |
| PC (Panlite) | x |
| PC (Iupilon) | x |
| POM (Duracon) | x |

A reference in parentheses indicates a product name. As the COP (cycloolefin polymer), Zeonex made by Zeon Corporation and Arton made by JSR Corporation were used, as the COC (cycloolefin copolymer), Optorez made by Nihon Kasei Kogyo Co., Ltd. and Topas made by Polyplastics Co., Ltd. were used, as the PMMA (methacryl resin), Parapet made by Kuraray Co., Ltd. was used, as the PC (polycarbonate), Panlite made by Teijin Chemicals Ltd. and Iupilon made by Mitsubishi Engineering-Plastics Corporation were used, and as the POM (polyacetal resin), Duracon made by Polyplastics Co., Ltd. was used. The thickness of the substrate was 1 mm.

In the experiment, a sample for tensile shearing test shown in FIG. 4 was formed. The first substrate and the second substrate were bonded to each other with the conditions shown in FIG. 4 by using an adhesive agent of 100% paraffin D (refer to Table 2), in which a number average molecular weight is 390, as the adhesive agent. The thickness of the adhesive layer was 30 µm.

As shown in Table 1, both the COP and the COC could be bonded by the adhesive agent composed of paraffin. On the other hand, all of the PMMA, the PC, and the POM could not be bonded by the adhesive agent composed of paraffin. Besides these, other resins such as polystyrene, LCP, and PPS were also tested. However, in materials other than a cycloolefin-based polymer, bonding could not be performed.

Bonding Strength Test—Concerning Influence of Heating Temperature

Next, a sample for a destruction test shown in FIGS. 5A and 5B was formed. FIG. 5A is a perspective view and FIG. 5B is a back view (a diagram viewed from the substrate 2 side).

Then, in FIG. 5C, four corners (each 14 mm² square) of the sample for a destruction test were fixed and a push-in test was then performed.

In addition, as the substrate, Zeonex (COP) made by ZEON Corporation was used.

Also, as the adhesive agent, paraffin A to paraffin E shown in the following Table 2 were used. As shown in Table 2, the paraffin A to the paraffin E have different average carbon numbers and different number average molecular weights. The temperatures, "20° C." to "80° C.", shown in Table 2 are press temperatures between the substrates. In addition, the thickness of the adhesive layer composed of each of the paraffins was in the range of 1 µm to 30 µm.

TABLE 2

|  | Adhesive agent | | | | |
| --- | --- | --- | --- | --- | --- |
|  | Paraffin A | Paraffin B | Paraffin C | Paraffin D | Paraffin E |
| Average carbon number | 18 | 23 | 26 | 28 | 33 |
| Average molecular weight | 250 | 322 | 365 | 390 | 470 |
| Density g/cm³ | 0.873 | 0.845 | 0.853 | 0.872 | 0.868 |
| Kinetic viscosity (40° C.) mm²/s | 4.3 | 12.3 | 23.3 |  | 67.9 |
| 20° C. | 30 | x | x | x | x |
| 30° C. | 42 | 33 | 30 | x | x |
| 40° C. | 90 | 40 | 25 | 8 | x |
| 50° C. | ⓒ | 74 | 58 | 32.8 | 4.6 |
| 60° C. | ⓒ | ⓒ | ⓒ | 60 | 73.5 |
| 70° C. | ⓒ | ⓒ | ⓒ | ⓒ | 12.9 |
| 80° C. | ⓒ | ⓒ | ⓒ | ⓒ | ⓒ |

\* Bonding conditions: 1.65 MPa (2.5 kN), bonding time 300 sec
\*\* ⓒ parent material destruction Experimental results when the adhesive agents composed of each of the paraffins were used are shown in lateral sections of "20° C." to "80° C." shown in Table 2. The symbol x shown in Table 2 indicates that the substrates could not be bonded to each other. The symbol ⓒ shown in Table 2 indicates parent material destruction. A section having a numerical value stated therein shows adhesion strength when the substrates are detached from each other due to destruction (interfacial fracture) of a section of the adhesive layer in a push-in test shown in FIG. 5C, and a unit is N (Newton). In addition, here, the above-mentioned parent material destruction is a phenomenon in which the substrates reach a state of destruction without the interfacial fracture occurring at the adhesive layer, and the parent material destruction indicates that adhesion strength is strongest.

As shown in Table 2, it was found that the smaller the number average molecular weight of paraffin, the more the substrates could be bonded to each other even at a low bonding temperature. This is considered to be because the smaller the number average molecular weight of paraffin, the more easily the paraffin diffuses (enters) into the substrate.

For example, in a case where the paraffin A of Table 2 was used, it was found that the substrates could be bonded to each other even at room temperature (20° C.). Also, even in a case where any adhesive layer was used, it was found that if a bonding temperature is set to be high, adhesion strength can be improved. From this table, it was found that in order to allow any adhesive agent of the paraffin A to the paraffin E to be used, it is preferable to set a heating temperature to be in the range of 50° C. to 80° C.

Also, as shown in Table 2, it was found that the smaller the number average molecular weight of paraffin, the smaller the kinetic viscosity of the adhesive agent becomes.

Next, as shown in the following Table 3, the same experiments as the aforementioned were performed using adhesive agents, in which each of macromonomer A to macromonomer F is added to the paraffin D. A sample or a test method used in the experiment is as described in FIGS. 5A to 5C. With respect to the paraffin D, Table 2 is referred to. The thickness of the adhesive layer of each sample was in the range of 1 µm to 30 µm.

TABLE 3

|  | Adhesive agent | | | | | |
| --- | --- | --- | --- | --- | --- | --- |
|  | Paraffin D + macro-monomer A | Paraffin D + macro-monomer B | Paraffin D + macro-monomer C | Paraffin D + macro-monomer D | Paraffin D + macro-monomer E | Paraffin D + macro-monomer F |
| Macro-monomer proportion | 3.3% | 5.0% | 10.0% | 30.0% | 5.0% | 5.0% |
| Macro-monomer molecular weight | 25000~30000 | 25000~30000 | 25000~30000 | 25000~30000 | 15000~30000 | 25000~40000 |
| Poly-ethylene oxide molecular weight | 4000 | 4000 | 4000 | 4000 | 2000 | 6000 |
| Azo mole number per 1 g | 0.24 mol/g | 0.24 mol/g | 0.24 mol/g | 0.24 mol/g | 0.45 mol/g | 0.16 mol/g |
| 20° C. | x | x | x | x | x | x |
| 30° C. | x | x | x | x | x | x |
| 40° C. | 9 | 8 | 8 | 5 | 8 | 11 |

TABLE 3-continued

|  | Adhesive agent | | | | | |
|---|---|---|---|---|---|---|
|  | Paraffin D + macro-monomer A | Paraffin D + macro-monomer B | Paraffin D + macro-monomer C | Paraffin D + macro-monomer D | Paraffin D + macro-monomer E | Paraffin D + macro-monomer F |
| 50° C. | 32 | 25 | 20 | 20 | 48 | 53 |
| 60° C. | 57 | 60 | 50 | 34 | 50 | 67 |
| 70° C. | ⓒ | ⓒ | ⓒ | ⓒ | ⓒ | ⓒ |
| 80° C. | ⓒ | ⓒ | ⓒ | ⓒ | ⓒ | ⓒ |

\* Bonding conditions: 1.65 MPa (2.5 kN), bonding time 300 sec
\*\* ⓒ parent material destruction The macromonomer A to the macromonomer F are all formed to have a structural formula expressed by the following Chem. 9. As the macromonomer A to the macromonomer D, VPE-0401 made by Wako Pure Chemical Industries, Ltd. was used, as the macromonomer E, VPE-0201 made by Wako Pure Chemical Industries, Ltd. was used, and as the macromonomer F, VPE-0601 made by Wako Pure Chemical Industries, Ltd. was used.

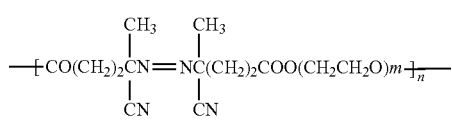

[Chem. 9]

In the macromonomer A to the macromonomer D, as shown in Table 3, the mixture ratios (proportion: % by weight) of the macromonomers included in the adhesive agents are different from each other. On the other hand, the macromonomer E and the macromonomer F are different in molecular weight, polyethylene oxide molecular weight, and molar quantity of an azo group per 1 g from those of the macromonomer A to the macromonomer D. The adhesive agents are those in which each of the macromonomer A to the macromonomer F dissolved in methanol is mixed with the paraffin D.

Experimental results when each adhesive agent was used are shown in lateral sections of "20° C." to "80° C." shown in Table 3. The symbol x shown in Table 3 indicates that the substrates could not be bonded to each other. The symbol ⓒ shown in Table 3 indicates parent material destruction. A section having a numerical value stated therein shows adhesion strength when the substrates are detached from each other due to destruction (interfacial fracture) of a section of the adhesive layer in a push-in test shown in FIG. 5C, and a unit is N (Newton). In addition, here, the above-mentioned parent material destruction indicates that adhesion strength is strongest.

Even if any adhesive layer containing a macromonomer was used, an excellent bonding result could be obtained.

Also, as shown in Table 3, it was found that even if any adhesive agent is used, the higher the bonding temperature, the more the adhesion strength can be improved.

As shown in Table 3, even in any sample, if a heating temperature is 70° C. or more, parent material destruction arises and from this, it was found that adhesion strength is very strong.

By this experiment, the mixture ratio of the macromonomer was defined to be in the range of 3% by weight to 30% by weight. Also, the preferable range of the molecular weight of the macromonomer was defined to be in the range of 20000 to 40000

Also, since a cleavage temperature of an azo group of a macromonomer is generally 60° C. or more, it is preferable that a bonding temperature be 60° C. or more.

Adhesion Strength Test—Concerning Influence of a Bonding Time

Next, experiments were performed with respect to adhesion strength when a bonding time was changed as shown in the following Table 4, by using adhesive agents which are composed of the paraffin D, the paraffin D+the macromonomer E, the paraffin D+the macromonomer B, and the paraffin D+the macromonomer F. A sample or a test method used in the experiment is as described in FIGS. 5A to 5C. With respect to the paraffin D, Table 2 is referred to.

TABLE 4

|  |  | Adhesive agent | | | |
|---|---|---|---|---|---|
|  |  | Paraffin D | Paraffin D + macro-monomer E | Paraffin D + macro-monomer B | Paraffin D + macro-monomer F |
| Macro-monomer proportion | | 0 | 5.0% | 5.0% | 5.0% |
| Macro-monomer molecular weight | | — | 15000~30000 | 25000~30000 | 25000~40000 |
| Poly-ethylene oxide molecular weight | | — | 2000 | 4000 | 6000 |
| Azo mole number per 1 g | | — | 0.45 mol/g | 0.24 mol/g | 0.16 mol/g |
| 60° C. | 3 min | 58 | 41 | 49 | 53 |
|  | 5 min | 60 | 50 | 60 | 67 |
|  | 10 min | 78 | 48 | 66 | 78 |
| 70° C. | 1 min | 60 | 50 | 48 | 60 |
|  | 3 min | ⓒ | ⓒ | ⓒ | ⓒ |
| 80° C. | 1 min | ⓒ | ⓒ | ⓒ | ⓒ |

\* Bonding conditions: 1.65 MPa (2.5 kN), bonding time 300 sec
\*\* ⓒ parent material destruction The temperatures, "60° C.", "70° C.", and "80° C.", shown in Table 4 are press temperatures between the substrates, and a time (min) stated in a section on the right side of each temperature represents a bonding time. The reason why the press temperature was set to be 60° C. or more is because a cleavage temperature of an azo group of a macromonomer is generally 60° C. Also, an experimental result when each adhesive agent was used is shown in each section on the right side of each temperature. The symbol ⓒ shown in Table 4 indicates parent material destruction. A section having a numerical value stated therein shows adhesion strength when the substrates are detached from each other due to destruction (interfacial fracture) of a section of the adhesive layer in a push-in test shown in FIG. 5C, and a unit is N (Newton). In addition, here, the above-mentioned parent material destruction indicates that adhesion strength is stronge As shown in FIG. 4, it was found that the longer the bonding time, the higher the adhesion strength becomes.

Bonding Strength Test—Concerning Influence of Pressure

In the experiment, an adhesion strength test was performed using the destruction test sample described in FIGS. 5A to 5C. As the adhesive agent, the paraffin C shown in Table 2 was used. FIG. 6 is a graph showing the relationship between adhesion pressure and adhesion strength. In addition, in the destruction test sample, adhesion strength when interfacial fracture arises and the substrates subjected to the interfacial fracture are detached from each other was measured.

As shown in FIG. 6, even if pressure changed, it was possible to obtain almost constant adhesion strength.

Concerning Adhesion Strength According to Addition of a Macromonomer

A sample for a destruction test shown in FIG. 7 was formed. With respect to the substrate, Zeonex (COP) made by Zeon Corporation was used.

As the adhesive agents, an adhesive agent composed only of the paraffin D and adhesive agents, in which each of VPE-0201, VPE-0401, and VPE-0601 made by Wako Pure Chemical Industries, Ltd. is added to the paraffin D, were used. In addition, as shown in the following Table 5, a plurality of samples was prepared in which even if the same macromonomer was used, the mixture ratios (% by weight) of the macromonomers were different from each other.

TABLE 5

| Kind of macromonomer | Macromonomer Proportion | Results | |
|---|---|---|---|
| Paraffin D only | 0 | 300 | interfacial fracture |
| VPE-0401 | 3.3% | 340 | |
| ↑ | 5.0% | parent material destruction | |
| ↑ | 10.0% | parent material destruction | |
| ↑ | 20.0% | parent material destruction | |
| VPE-0201 | 5.0% | parent material destruction | |
| VPE-0401 | 5.0% | parent material destruction | |
| VPE-0601 | 5.0% | parent material destruction | |
| VPE-0201 | 20.0% | parent material destruction | |
| VPE-0401 | 20.0% | parent material destruction | |
| VPE-0601 | 20.0% | parent material destruction | |

~Bonding conditions~
Material: paraffin D
Temperature: 80° C.
Pressure: 3.7 MPa
Bonding time: 300 sec As shown in FIG. 7, in the sample for a destruction test, a substrate 1 had a size of 26 mm×76 mm, similarly to FIG. 5B, and a substrate 2 had a size of 20 mm×76 mm. The sample for a destruction test shown in FIG. 7 was made such that influence of the adhesive layer on pressure becomes relatively larger by making an adhesion area small, compared to the sample for a destruction test used in FIGS. 5A to 5C.

As shown in Table 5, both the adhesive agent composed only of the paraffin D and the adhesive agent in which 3.3% by weight of the macromonomer of VPE-0401 is added thereto were subjected to interfacial fracture.

On the other hand, also in the adhesive agent in which VPE-0401 was used as the macromonomer, since adhesion strength was improved by making a mixture ratio large or using another macromonomer, interfacial fracture did not occur and parent material destruction occurred.

From the experimental results of Table 5, it was found that it is possible to improve adhesion strength by adding a macromonomer to the adhesive agent.

Experiment of Pressure Cooker Test (PCT)

A COP (Zeonor made by Zeon Corporation) sheet having a thickness of 100 μm and a COP (Zeonex made by Zeon Corporation) plate having a thickness of 2 mm and having flow paths formed therein were bonded to each other through the adhesive layer.

In an example, the adhesive agent composed only of the paraffin B was used. With respect to the bonding conditions in this example, a temperature was set to be 80° C.; pressure, 1.65 MPa; and a bonding time, 300 sec. The thickness of the adhesive layer was 10 μm.

In a comparative example, an adhesive sheet composed of a polymer (styrene series thermoplastic elastomer), paraffin, and toluene was used. Mixture ratios of the polymer, the paraffin, and the toluene were 15% by weight, 15% by weight, and 70% by weight. With respect to the bonding conditions in the example, a temperature was set to be 50° C.; pressure, 0.6 MPa; and a bonding time, 60 sec. The thickness of the adhesive layer (an adhesive sheet) was 35 μm.

With respect to the conditions of the pressure cooker test (PCT), a time was set to be 24 hours; a temperature, 120° C.; pressure, 0.2 MPa; and humidity, 100%.

FIG. 8 is a photograph of the example after the PCT and FIG. 9 is a photograph of the comparative example after the PCT.

It was found that as shown in FIG. 8, in the example, even after the PCT, cracks were not generated, whereas in the comparative example of FIG. 9, cracks generated in a section of the adhesive sheet.

In addition, also with respect to a sample in which a COP plate having the thickness of 1 mm was bonded thereto by the adhesive agent of the above-mentioned example, the PCT was performed. However, it was found that cracks were not generated, similarly to FIG. 8.

In this manner, in this example, it was found that durability is excellent.

Experiment of Naphthene

An adhesive agent composed only of naphthene (a number average molecular weight: 350) was used in bonding of the COP (Zeonor made by Zeon Corporation) sheet having a thickness of 100 μm to the COP (Zeonex made by Zeon Corporation) plate having a thickness of 2 mm. With respect to the bonding conditions, a temperature was set to be 80° C.; pressure, 1.85 kN (1 MPa); and a bonding time, 1 min. Then, as shown in FIG. 10, when a tensile strength test was performed at the rate of 10 mm per 1 min, since parent material destruction, but not interfacial fracture, occurred, it was found that strong adhesion was made, similarly to a case where paraffin was used.

BRIEF DESCRIPTION OF DRAWINGS

FIGS. 5A to 5C are conceptual diagrams showing a sample for a destruction test and an experimental method used in the experiments of Tables 2 to 4 and FIG. 5.

FIG. 6 is a graph showing the relationship between adhesion pressure and adhesion strength when substrates are bonded to each other by using an adhesive agent composed of paraffin.

FIG. 7 is a conceptual diagram showing a sample for a destruction test and an experimental method used in an experiment shown in Table 5.

EXPLANATION OF REFERENCE

Figure 1:
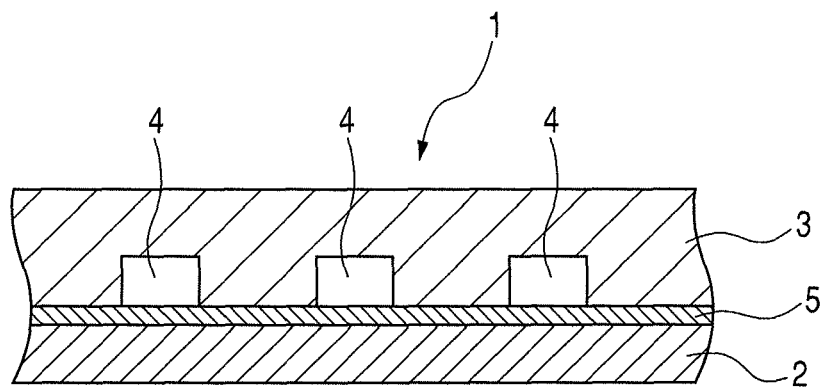
FIG. 1 is a partial cross-sectional view of a microchip plate of an embodiment cut in the thickness direction.
Figure 2:
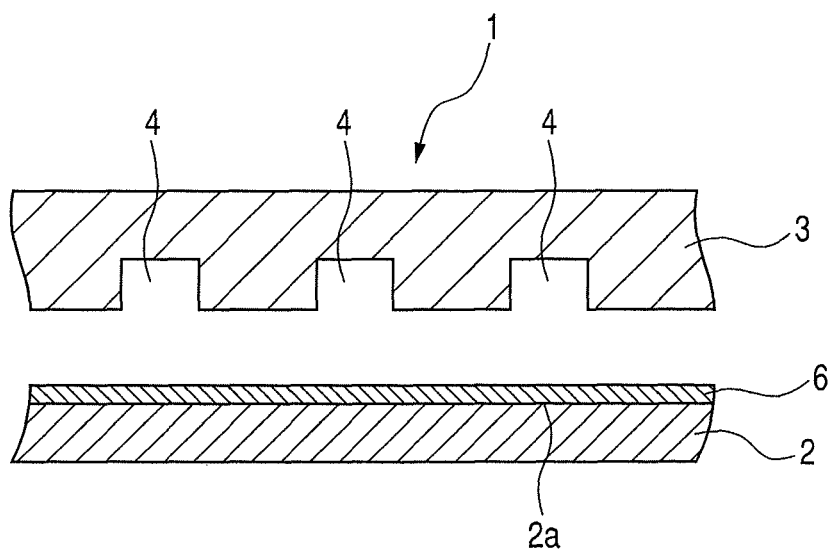
FIG. 2 is a process diagram for explaining a production method of the microchip plate of the embodiment (a partial cross-sectional view of the microchip plate during a manufacturing process cut in the thickness direction).
Figure 3:
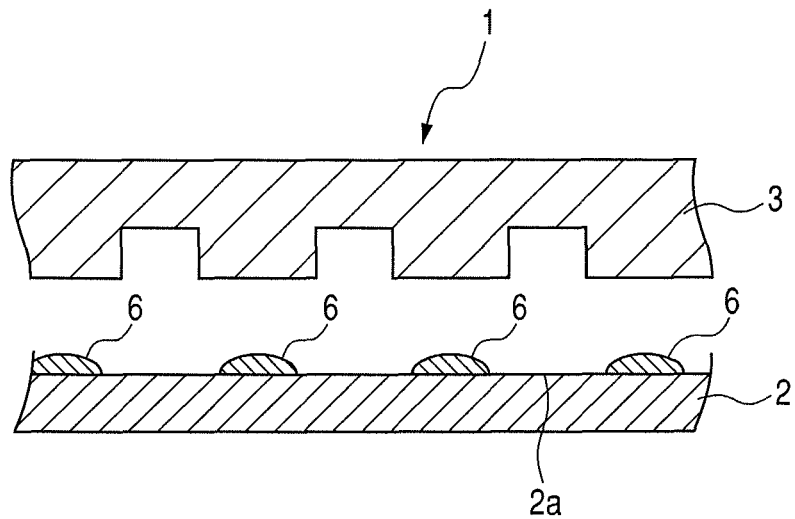
FIG. 3 is a process diagram for explaining a production method of the microchip plate of the embodiment, which is different from the method in FIG. 2 (a partial cross-sectional view of the microchip plate during a manufacturing process cut in the thickness direction).
Figure 4:
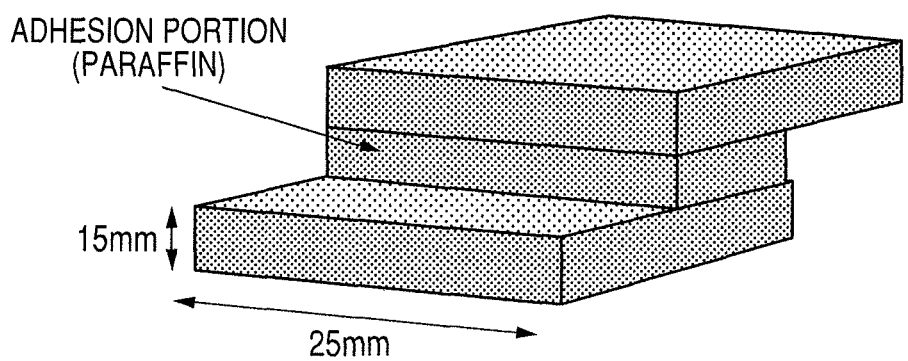
FIG. 4 is a conceptual diagram of a test sample used in an experiment shown in Table 1.
Figure 8:
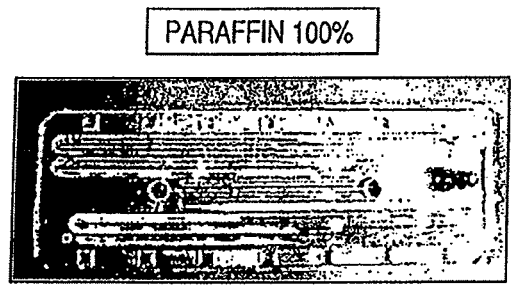
FIG. 8 is a photograph showing a state after a PCT in an example.
Figure 9:
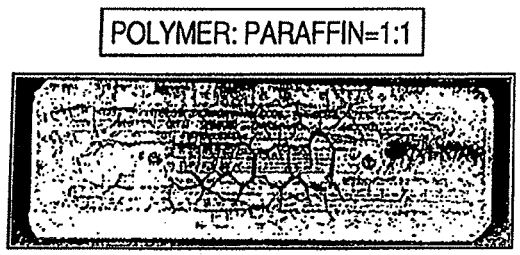
FIG. 9 is a photograph showing a state after the PCT in a comparative example.
Figure 10:
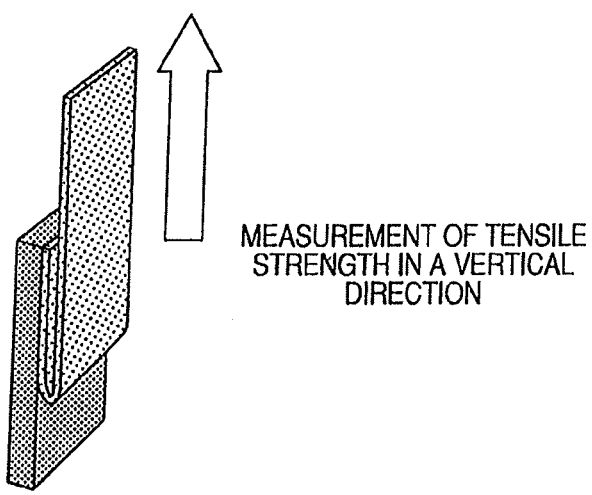
FIG. 10 is a conceptual diagram showing an experimental method in an example in which an adhesive agent composed of naphthene is used.

1: MICROCHIP PLATE
2: FIRST SUBSTRATE
3: SECOND SUBSTRATE
4: FLOW PATH
5: ADHESIVE LAYER
6: ADHESIVE AGENT

What is claimed is:

1. A microchip plate comprising:
a first substrate and a second substrate which are bonded to each other through an adhesive layer, the second substrate including a flow path formed on the side facing the first substrate,
wherein the first substrate and the second substrate are each formed of a cycloolefin polymer (COP) or a cycloolefin copolymer (COC),
wherein the adhesive layer is formed of paraffin or naphthene and includes at least one of additives selected from a group consisting of an adhesion auxiliary material, a polymer constituting each of the first substrate and the second substrate, and a macromonomer, the paraffin or naphthene being a main component of the adhesive layer and having a concentration greater than that of the macromonomer that is in a range of less than 30% by weight,
wherein a number average molecular weight of each of the paraffin and the naphthene is in the range of 100 to 1000, and the paraffin or the naphthene exhibits adhesiveness for bonding the first and second substrate, and
wherein the paraffin or the naphthene diffuses between polymer chains of the COP or polymer chains of the COC to activate a molecular chain of a polymer surface of the COP or the COC.

2. The microchip plate according to claim 1, wherein the first substrate is formed of a sheet having a thickness of about 500 μm, and the second substrate is formed of a sheet having a thickness 0.5 mm to 10 mm.

3. The microchip plate according to claim 1, wherein an average number of carbon number of the paraffin or the naphthene is in the range of 7 to 72.

4. The microchip plate according to claim 1, wherein a number average molecular weight of the polymer constituting each of the first substrate and the second substrate is in the range of 1000 to 10000.

5. The microchip plate according to claim 1, wherein a number average molecular weight of the macromonomer is in the range of 20000 to 40000.

6. The microchip plate according to claim 1, wherein a mixture ratio (proportion) of the macromonomer in the adhesive layer is in the range of 30% by weight to 80% by weight.

7. The microchip plate according to claim 1, wherein the macromonomer is formed of an initiator having a bridged structure composed of a macromolecular chain, which is a soft segment, and an azo group, which are continuously bound.

8. The microchip plate according to claim 7, wherein the macromonomer is formed to have the following structural formula:

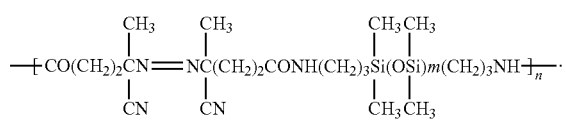

[Chem. 1]

9. The microchip plate according to claim 7, wherein the macromonomer is formed to have the following structural formula:

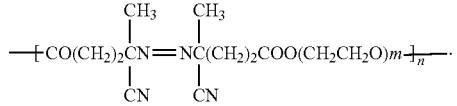

[Chem. 2]

10. A process for producing a microchip plate including a first substrate and a second substrate which are bonded to each other through an adhesive layer, the second substrate including a flow path formed on the side facing the first substrate, the process comprising the steps of:
applying an adhesive agent which is formed of paraffin or naphthene and which includes at least one of additives selected from a group consisting of an adhesion auxiliary material, a polymer constituting each of the first substrate and the second substrate, and a macromonomer, to at least one of the facing surfaces of the first substrate and the second substrate, which are each formed of a cycloolefin polymer (COP) or a cycloolefin copolymer (COC), the paraffin or the naphthene being a main component of the adhesive agent and having a concentration greater than that of the macromonomer that is in the range of less than 30% by weight; and
bonding the first substrate and the second substrate to each other by the adhesive agent in a state where the facing surfaces of the first substrate and the second substrate are made to face each other with the adhesive agent interposed therebetween,
wherein a number average molecular weight of each of the paraffin and the naphthene is in the range of 100 to 1000, and the paraffin or the naphthene exhibits adhesiveness for bonding the first and second substrate, and
wherein the paraffin or the naphthene diffuses between polymer chains of the COP or polymer chains of the COC to activate a molecular chain of a polymer surface of the COP or the COC.

11. The process for producing a microchip plate according to claim 10, wherein the first substrate is formed of a sheet having a thickness of about 500 μm, and the second substrate is formed of a sheet having a thickness of 0.5 mm to 10 mm.

12. The process for producing a microchip plate according to claim 10, wherein a number average molecular weight of the polymer constituting each of the first substrate and the second substrate is adjusted to be to be in the range of 1000 to 10000.

13. The process for producing a microchip plate according to claim 10, wherein a number average molecular weight of the macromonomer is adjusted to be in the range of 20000 to 40000.

14. The process for producing a microchip plate according to claim 10, wherein a mixture ratio (proportion) of the macromonomer in the adhesive agent is to be in the range of 30% by weight to 80% by weight.

15. The process for producing a microchip plate according to claim 10, wherein the macromonomer is formed of an initiator having a bridged structure composed of a macromolecular chain, which is a soft segment, and an azo group, which are continuously bound.

16. The process for producing a microchip plate according to claim 15, wherein the macromonomer is formed to have the following structural formula:

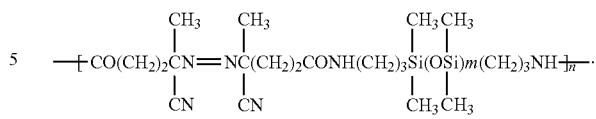
[Chem. 3]

17. The process for producing a microchip plate according to claim 15, wherein the macromonomer is formed to have the following structural formula:

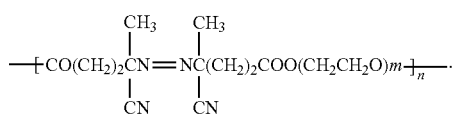
[Chem. 4]

* * * * *